(12) United States Patent
Okita

(10) Patent No.: US 7,718,327 B2
(45) Date of Patent: May 18, 2010

(54) OVERLAY MANAGEMENT METHOD AND APPARATUS, PROCESSING APPARATUS, MEASUREMENT APPARATUS AND EXPOSURE APPARATUS, DEVICE MANUFACTURING SYSTEM AND DEVICE MANUFACTURING METHOD, AND PROGRAM AND INFORMATION RECORDING MEDIUM

(75) Inventor: Shinichi Okita, Nishitokyo (JP)

(73) Assignee: Nikon Corporation, Tokyo (JP)

( * ) Notice: Subject to any disclaimer, the term of this patent is extended or adjusted under 35 U.S.C. 154(b) by 9 days.

(21) Appl. No.: 12/176,902

(22) Filed: Jul. 21, 2008

(65) Prior Publication Data

US 2008/0286667 A1     Nov. 20, 2008

Related U.S. Application Data

(63) Continuation of application No. PCT/JP2007/050761, filed on Jan. 19, 2007.

(30) Foreign Application Priority Data

Jan. 26, 2006    (JP)    ............................ 2006-017029

(51) Int. Cl.
*G03F 9/00*     (2006.01)
*G03C 5/00*     (2006.01)

(52) U.S. Cl. .......................... 430/22; 430/30; 356/399; 356/400; 356/401

(58) Field of Classification Search .................. 430/22, 430/30; 356/399, 400, 401
See application file for complete search history.

(56) References Cited

U.S. PATENT DOCUMENTS

| | | | |
|---|---|---|---|
| 5,863,680 A | 1/1999 | Kawakubo et al. | |
| 5,989,762 A | 11/1999 | Takaoka | |
| 6,737,208 B1 | 5/2004 | Bode et al. | |
| 6,897,956 B2 * | 5/2005 | Noguchi et al. | ............. 356/401 |
| 2003/0160960 A1 | 8/2003 | Noguchi et al. | |
| 2004/0159397 A1 | 8/2004 | Bode et al. | |
| 2005/0210438 A1 | 9/2005 | Verstappen et al. | |
| 2006/0033916 A1 | 2/2006 | Sugihara et al. | |

* cited by examiner

*Primary Examiner*—Christopher G Young
(74) *Attorney, Agent, or Firm*—Staas & Halsey LLP

(57) ABSTRACT

In repeated processes (steps 201 to 213) of lot processing, an analytical apparatus detects abnormality of overlay, that is, deterioration of overlay accuracy in step 211 and optimizes an apparatus parameter of an exposure apparatus so that the abnormality is solved (so that the overlay accuracy is improved), and then the optimization result is promptly reflected in the exposure apparatus and a measurement/inspection instrument. Since such optimization is performed without stopping the lot processing, the productivity of devices is not lowered.

46 Claims, 6 Drawing Sheets

OVERLAY MANAGEMENT METHOD AND APPARATUS, PROCESSING APPARATUS, MEASUREMENT APPARATUS AND EXPOSURE APPARATUS, DEVICE MANUFACTURING SYSTEM AND DEVICE MANUFACTURING METHOD, AND PROGRAM AND INFORMATION RECORDING MEDIUM

CROSS-REFERENCE TO RELATED APPLICATIONS

This application is a continuation of International Application PCT/JP2007/050761, with an international filing date of Jan. 19, 2007, the disclosure of which is hereby incorporated herein by reference in its entirety, which was not published in English.

BACKGROUND OF THE INVENTION

1. Field of the Invention

The present invention relates to overlay management methods and apparatuses, processing apparatuses, measurement apparatuses and exposure apparatuses, device manufacturing systems and device manufacturing methods, and programs and information recording media, and more particularly, to a an overlay management method and an overlay management apparatus that manage overlay of patterns that are formed by transfer so as to be overlaid on an object, a processing apparatus, the measurement apparatus and the exposure apparatus that are equipped with the overlay management apparatus, a device manufacturing system that is equipped with the overlay management apparatus and a device manufacturing method that uses the overlay management method, and a program that makes a computer execute the overlay management method and an information recording medium that records the program.

2. Description of the Background Art

In manufacturing processes of electronic devices (microdevices) such as semiconductor devices and liquid crystal display devices, circuit patterns on a reticle (a mask) are transferred so as to be overlaid to each of a plurality of areas on a semiconductor substrate (a wafer) or a liquid crystal substrate (a glass plate). On this operation, in order to accurately overlay the device patterns with each area on the substrate, images of the device patterns to be transferred and the substrate need to be positioned with high accuracy. Therefore, positioning of a wafer before exposure, which is a so-called wafer alignment, is conventionally performed (e.g. refer to Kokai (Japanese Unexamined Patent Application Publications) No. 61-044429).

In the wafer alignment, for example, wafer marks arranged with each of a plurality of areas that have already been formed on the substrate are photoelectrically detected, and positional information of the marks are detected using a predetermined waveform processing algorithm based on detected mark waveform. Then, based on the detection result of the positional information, a pattern arrangement on the substrate is obtained by a statistical computation, and the pattern positions that are estimated from the pattern arrangement are assumed to be the overlay transfer positions of new patterns. In the wafer alignment, various types of waveform detection processing and computation processing are performed under the processing parameters that set the various types of processing, which are from the measurement of the wafer marks on the substrate up to the computation of the overlay transfer positions of patterns.

In the various types of processing, if the setting value of the processing parameter is not appropriately set, lowering of overlay accuracy is induced as a consequence, and therefore, the setting value of the processing parameter is changed when necessary. In conventional methods, each time when the setting value is changed, the manufacturing process of devices is suspended, and overlay error of the patterns (e.g. resist images) formed on the substrate is measured by performing test exposure and development with a test wafer, and whether or not the parameter thereof is appropriately set is confirmed. Such confirmation takes a lot of time and consumes a lot of costs.

SUMMARY OF THE INVENTION

According to a first aspect of the present invention, there is provided a first overlay management method, comprising: an optimization process in which, while sequentially performing to each of a plurality of objects a series of processes that include a transfer process in which with respect to a first pattern on an object, a second pattern to be transferred is transferred so as to be overlaid after alignment processing of the first pattern and the second pattern is performed, an overlay error between the first pattern and the second pattern on the object is actually measured using a measurement instrument at arbitrary timing, and in the case where overlay accuracy of the patterns is judged to deteriorate based on a result of the actual measurement, a processing condition of the alignment processing is optimized using an analytical apparatus.

With this method, the processing condition of alignment is optimized without stopping a series of processes, and therefore, even when the overlay accuracy deteriorates, the overlay accuracy is promptly improved.

According to a second aspect of the present invention, there is provided a second overlay management method, comprising: an optimization process in which, while sequentially performing to each of a plurality of objects a series of processes that include a transfer process in which, with respect to a first pattern formed in each of a plurality of areas on an object, a second pattern to be transferred is transferred so as to be overlaid after alignment processing of the first pattern and the second pattern is performed, an overlay error between a pattern element of the first pattern and a pattern element of the second pattern on the object is actually measured using a measurement instrument at arbitrary timing, and in the case where overlay accuracy of the patterns is judged to deteriorate based on a result of the actual measurement, a processing condition in the series of processes is optimized using an analytical apparatus.

With this method, the processing condition of alignment is optimized without stopping a series of processes, and therefore, even when the overlay accuracy of a pattern element within the pattern deteriorates, the overlay accuracy is promptly improved.

According to a third aspect of the present invention, there is provided an overlay management apparatus that manages overlay exposure to each of a plurality of objects, wherein overlay of a pattern on the plurality of objects is managed using either of the first or second overlay management method of the present invention. With this apparatus, since the overlay of patterns is managed using the overlay management method of the present invention, the productivity of devices is improved.

According to a fourth aspect of the present invention, there is provided a processing apparatus that executes at least a part of a series of processes in which a pattern is formed on an object, the apparatus comprising: the overlay management apparatus of the present invention. With this apparatus, since the overlay of patterns is managed by the overlay management apparatus of the present invention, the productivity of devices is improved.

According to a fifth aspect of the present invention, there is provided a measurement apparatus that measures information on an overlay error of a pattern formed on an object, the apparatus comprising: the overlay management apparatus of the present invention. With this apparatus, since the overlay of patterns is managed by the overlay management apparatus of the present invention, the productivity of devices is improved.

According to a sixth aspect of the present invention, there is provided an exposure apparatus that transfers a pattern onto an object, the apparatus comprising: the overlay management apparatus of the present invention. With this apparatus, since the overlay of patterns is managed by the overlay management apparatus of the present invention, the productivity of devices is improved.

According to a seventh aspect of the present invention, there is provided a device manufacturing system, comprising: an exposure apparatus that transfers a pattern so as to be overlaid to each of a plurality of different areas on an object; a posterior measurement instrument that measures information on an overlay error of the pattern after the transfer of the pattern; and the overlay management apparatus of the present invention that manages overlay of the pattern on the object based on information on the exposure apparatus and a measurement result of the posterior measurement instrument. With this system, since the overlay of patterns is managed by the overlay management apparatus of the present invention, the productivity of devices is improved.

According to an eighth aspect of the present invention, there is provided a device manufacturing method, comprising: an exposure process in which a pattern is transferred so as to be overlaid to each of a plurality of different areas on an object; a posterior measurement process in which information on an overlay error of the pattern is measured after the exposure process is executed; and an overlay management process in which overlay of the pattern on the object is managed based on information on the exposure process and information on a measurement result of the posterior measurement process, using either of the first or second overlay management method of the present invention. With this method, since the overlay of patterns is managed using either of the first or second overlay management method of the present invention, the productivity of devices is improved.

According to a ninth aspect of the present invention, there is provided a program that makes a computer execute analytical processing of a processing condition of alignment processing of an object and a pattern when the pattern is formed so as to be overlaid to each of a plurality of different areas on the object, using either of the first or second overlay management method of the present invention. By installing this program in a computer, the overlay of patterns is managed by the computer using either of the first or second overlay management method of the present invention, and therefore the productivity of devices is improved. Further, the program of the present invention can be recorded in a computer-readable information recording medium. Accordingly, according to another aspect of the present invention, it can be said that the present invention is an information recording medium that can be read by a computer in which the program of the present invention is recorded.

BRIEF DESCRIPTION OF THE DRAWINGS

In the accompanying drawings.

DESCRIPTION OF THE EMBODIMENTS

An embodiment of the present invention will be described below, referring to FIGS. 1 to 6.

Figure 1:
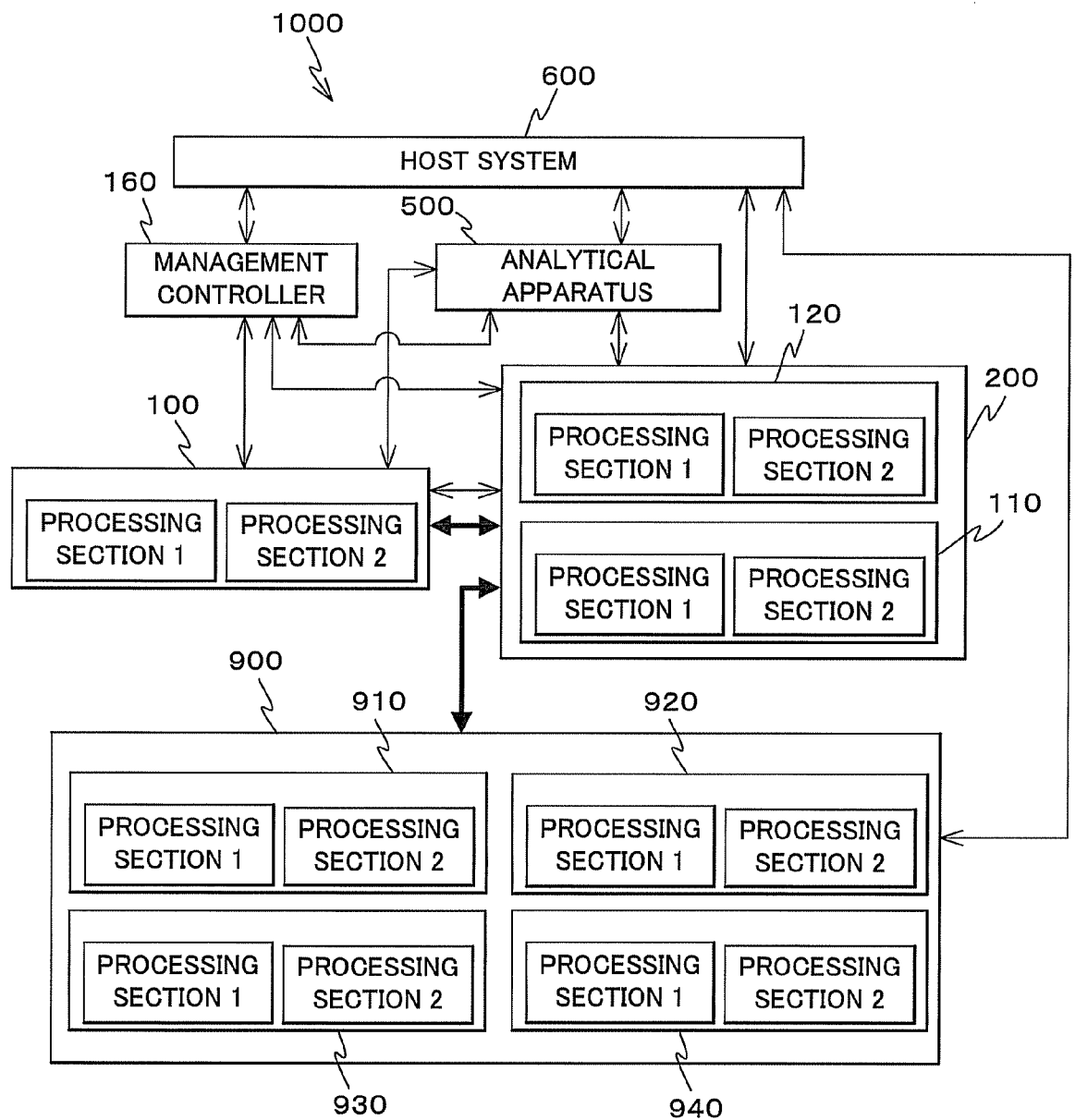
FIG. 1 is a view showing a schematic configuration of a device manufacturing system related to an embodiment of the present invention.

FIG. 1 shows a schematic configuration of a device manufacturing system 1000 related to the embodiment of the present invention. Device manufacturing system 1000 is a system constructed in a device manufacturing plant to process substrates, for example, semiconductor wafers (hereinafter, referred to as "wafers") and manufacture microdevices. As shown in FIG. 1, device manufacturing system 1000 is equipped with an exposure apparatus 100, a track 200 that is placed adjacent to exposure apparatus 100, a management controller 160, an analytical apparatus 500, a host system 600 and a device manufacturing processing apparatus group 900.

[Exposure Apparatus]

Exposure apparatus 100 is an apparatus that transfers a device pattern on a wafer on which a photoresist is coated. Exposure apparatus 100 is equipped with an illumination system that emits an illumination light for exposure, a stage that holds a reticle on which a device pattern and the like are formed that are illuminated by the illumination light, a projection optical system that projects the device pattern and the like illuminated by the illumination light, a stage that holds a wafer subject to exposure, their control system, and the like. Exposure apparatus 100 transfers the device pattern on the reticle to a plurality of different areas on the wafer, by driving each of the stages with respect to the illumination light for exposure and alternately repeating synchronous scanning of the reticle and the wafer and stepping of the wafer. That is, exposure apparatus 100 is an exposure apparatus by a scanning exposure (step-and-scan) method.

Figure 2A:
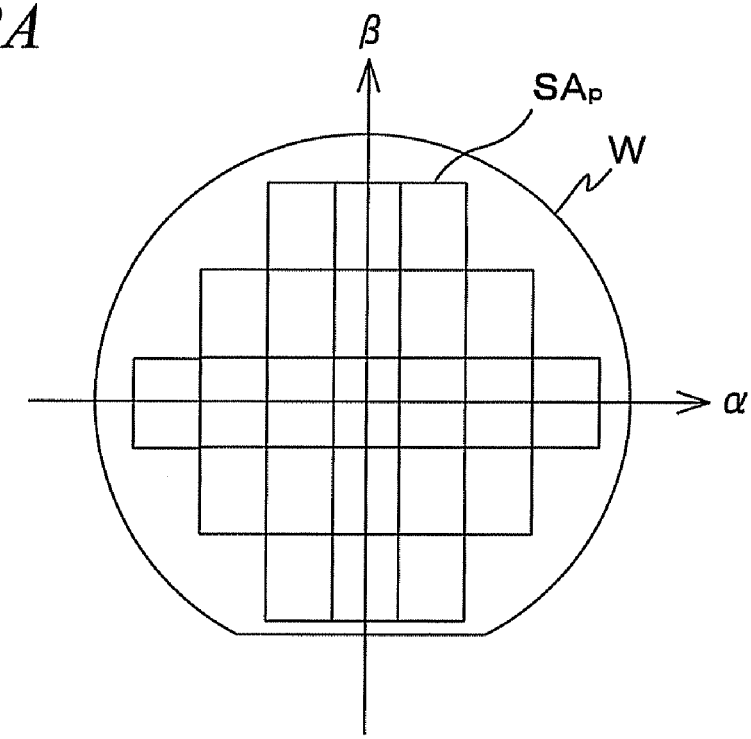
FIGS. 2A and 2B are views showing an example of a wafer.
Figure 2B:
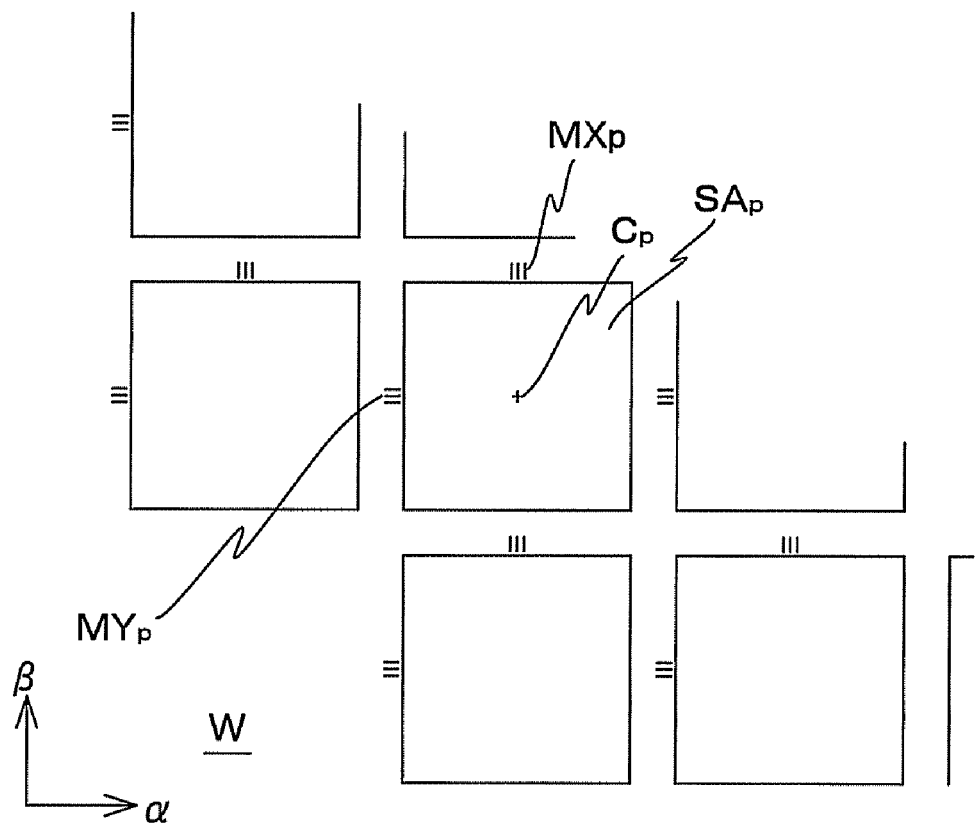

FIG. 2A shows an example of a substrate to be used for device manufacturing, that is, an example of wafer W subject to exposure in exposure apparatus 100. As shown in FIG. 2A, on wafer W, a plurality of shot areas $SA_P$ on which device patterns are formed have been already formed by an exposure process. As shown in FIG. 2B, to each shot area $SA_P$, wafer marks ($MX_P$, $MY_P$) are arranged. The wafer mark ($MX_P$, $MY_P$) is a mark from the shape or the like of which positional information can be detected. For example, in FIG. 2B, the wafer mark ($MX_P$, $MY_P$) is shown as a line-and-space mark. As the shape of the wafer mark, besides the line-and-space mark, a box mark, a cross mark and the like can be employed.

In exposure apparatus 100, overlay exposure of the device pattern on the reticle needs to be accurately performed with respect to shot area $SA_P$ on wafer W. In order to realize the accurate overlay exposure, the position of each shot area $SA_P$ on wafer W needs to be accurately obtained. The wafer marks ($MX_p$, $MY_P$) are arranged for obtaining the position of each shot area $SA_P$ (e.g. the position of a center $C_P$ thereof in FIG. 2). Since the wafer marks ($MX_P$, $MY_P$) are formed by transfer together with the device pattern of shot area $SA_P$ to which the wafer marks are arranged, a positional relation between the wafer marks ($MX_P$, $MY_P$) and the device pattern on wafer W is substantially fixed, and therefore, center position $C_P$ can be recognized if the positions of the wafer marks ($MX_P$, $MY_P$) are obtained.

Incidentally, wafer W, shot areas $SA_P$, the wafer marks ($MX_P$, $MY_P$) shown in FIGS. 2A and 2B are merely examples, and their sizes, the number of the wafer marks per shot area, the placement position and the shape of the wafer marks, and the like can be changed as needed. In particular, in the case where wafer alignment is performed, also taking deformation of the shot area itself into consideration, the number of the wafer marks per shot area will be plural per axis, and at least some of a plurality of the wafer marks are placed also at positions other than the position that corresponds to center $C_P$ of shot area $SA_P$.

In order to measure the position of the wafer marks ($MX_P$, $MY_P$), an off-axis alignment system for measuring the position of the wafer mark ($MX_P$, $MY_P$) is arranged in exposure apparatus 100. This alignment system illuminates the wafer surface including the wafer marks ($MX_P$, $MY_P$) using an optical system equipped inside, and guides a reflected light from the wafer surface to an alignment sensor equipped inside using the optical system, and then photoelectrically detects a signal corresponding to the reflected light using the alignment sensor. The detected signal has a waveform corresponding to, for example, unevenness of the wafer surface or a distribution of reflectivity. The alignment system extracts a waveform corresponding to the mark (a mark waveform) from the detected waveform data, and based on the extraction result, detects a position coordinate of the mark waveform within a detection field of the alignment sensor. Based on the detected position coordinate of the mark waveform and a position coordinate of the detection field itself of the alignment sensor, the alignment system computes the positions of the wafer marks ($MX_p$, $MY_P$) in an XY coordinate system. In exposure apparatus 100, a transfer position of the device pattern is determined based on the computation result.

Incidentally, in order to perform accurate overlay exposure of the device patterns, positional information of all shot areas $SA_P$ on the wafer may be measured, but such a method could affect the throughput. Thus, in exposure apparatus 100, a global alignment technology is employed, in which the wafer marks ($MX_P$, $MY_P$) to be actually measured are limited and from the measurement result of the measured positions of the wafer marks ($MX_P$, $MY_P$), the arrangement of shot areas $SA_P$ on the wafer is statistically estimated. In exposure apparatus 100, wafer alignment by a so-called EGA (Enhanced Global Alignment) method is employed as the global alignment, in which the deviation of actual shot arrangement with respect to the design shot arrangement is expressed in the polynomial of coordinate axes (Wx, Wy) that are parallel to an X-axis and a Y-axis respectively having the center of wafer W as its origin and/or coordinate axes (Sx, Sy) having the center of shot area $SA_P$ as its origin, and the proper coefficients in the polynomial are obtained by performing a statistical computation. In the wafer alignment by the EGA method, first of all, several shot areas $SA_P$ subject to measurement whose wafer marks ($MX_P$, $MY_P$) are measured are selected. The selected shot areas are called sample shots. The alignment system measures the positions of the wafer marks ($MX_P$, $MY_P$) arranged at the samples shots (samples makes). Hereinafter, such a measurement operation will be referred to as an EGA measurement.

In the EGA measurement, the judgment is made of whether or not the measured waveform data is appropriate as data used to extract the mark waveform. Specifically, how accurately the mark waveform can be detected from the waveform data is obtained from the shape of the waveform data, and the degree of accuracy is quantified and computed as a detection result score. In the case where this detection result score is better than a predetermined threshold value, it is assumed that the sample marks could be detected and the mark detection result of the sample marks is regarded as OK, and otherwise the mark detection result of the sample marks is regarded as NG.

In the wafer alignment by the EGA method, a correction amount of the XY position coordinate of each shot area $SA_P$ is estimated from the result of the EGA measurement, that is, the statistical computation based on positional information of several sample marks. Hereinafter, such a computation will be referred to as an EGA computation. Incidentally, the wafer alignment by the EGA method is disclosed in detail in, for example, Kokai (Japanese Unexamined Patent Application Publication) No. 61-044429 and the corresponding U.S. Pat. No. 4,780,617 and the like, and as long as the national laws in designated states or elected states, to which this international application is applied, permit, the disclosure of the publication and U.S. patent cited above are fully incorporated herein by reference.

An XY correction amount of the position of each shot area that is obtained by this polynomial is called an EGA correction amount. The coefficients of the polynomial obtained by the wafer alignment by the EGA method are obtained by the least-squares method, and therefore a deviation (an error of a nonlinear component) remains between the actual measurement value of the mark position and the mark position corrected by the EGA correction amount. Such a deviation is called a residual error. It is a matter of course that the residual error is preferably small from the viewpoint of overlay accuracy.

One of means for reducing the residual error is to make an EGA polynomial model be a high-order expression. The residual error can naturally be reduced by, for example, not making the EGA polynomial model be a primary expression of (Wx, Wy) or (Sx, Sy) taking into consideration a linear component of the arrangement of shot areas $SA_P$ (scaling of wafer W with the center of wafer W as a reference, rotation (rotation also taking into consideration a degree of orthogonality of a component corresponding to the X-axis and a component corresponding to the Y-axis of the shot arrangement), and each component of an offset) and a linear component of deformation of shot area $SA_P$ itself (scaling of shot area $SA_P$ with the center of shot area $SA_P$ as a reference, rotation (rotation also taking into consideration a degree of orthogonality of a component corresponding to the X-axis and a component corresponding to the Y-axis of the shot area), and each component of an offset); but making the EGA polynomial model be a quadratic expression of (Wx, Wy) also taking into consideration a second-order component of the arrangement of shot areas $SA_P$, or a cubic expression of (Wx, Wy) also taking into consideration a third-order component of the arrangement of shot areas $SA_P$. In general, higher the order of the EGA polynomial model becomes, smaller the entire residual error becomes, but it becomes necessary to pay attention so as prevent the excessive correction from being performed. Further, in the case of making the EGA polynomial model a high-order expression, the number of sample marks needs to be increased accordingly. Further, the model also taking the high-order component of (Sx, Sy) into consideration can be employed as a matter of course.

Further, in the case where measurement results of some of sample marks are remarkably deviated from the actual shot arrangement, the entire residual error tends to be larger.

Accordingly, it is desirable to reject such measurement results of the positions of the sample marks so that they are not used in the EGA computation. That is, it is also possible to increase the position estimation accuracy of shot areas $SA_P$ by not using some of positional information of the sample marks, which have been measured by the EGA measurement, in the EGA computation. As is described above, the selection of the number and/or the placement of sample marks is/are (an) important factor(s) for the wafer alignment by the EGA method.

[Alignment-related Parameter]

In exposure apparatus 100, several factors that set operations related to the wafer alignment by the EGA method by the alignment system described above are parameterized. In exposure apparatus 100, in a state where the setting values are set for these parameters (which are referred to as alignment-related parameters), the wafer alignment is performed under the setting values. The alignment-related parameters are mainly classified into alignment processing parameters used as processing conditions of the EGA measurement or the EGA computation, and overlay exposure correction condition parameters such as the EGA correction amount, or a correction amount of an overlay transfer position corresponding to a nonlinear component of the arrangement of shot areas $SA_P$ on wafer W.

As the alignment processing parameters, there are parameters related to sample marks, to the alignment system, to the alignment sensor, to waveform processing, to the EGA polynomial model or the like. As the alignment processing parameters related to sample marks, there are parameters related to the number of sample marks, the placement thereof on the wafer, and the shape of the mark. Further, as the alignment processing parameters related to the alignment system, there are parameters related to illumination conditions of sample marks, an alignment sensor, and focus of an optical system of the alignment system. Further, the parameters related to illumination conditions include parameters related to wavelength of an illumination light, selection of a contrast field as to whether a zero-order light from a sample mark should be selected or not, the intensity of the illumination light, and selection of presence/absence of a phase difference illumination. Further, the parameters related to the alignment sensor include parameters for selecting the methods of various sensors such as an FIA (Field Image Alignment) method, an LSA (Laser Step Alignment) method, an LIA (Laser Interferometric Alignment) method, or the like. Further, the parameters related to focus of the optical system include an offset component (an alignment focus offset) that is to be added when performing focus adjustment, and the like.

Further, the parameters related to waveform processing include a signal processing algorithm (an edge extraction method, a template matching method, a folding-back autocorrelation method or the like, a slice level or the like), a threshold value of OK/NG of the mark detection result score described above, a contrast limit, a slice level and the like. Further, the parameters related to the EGA polynomial model include types of the EGA polynomial models (a 6-parameter model, a 10-parameter model, an intra-shot averaged model, a shot factor indirectly-applied model, a high-order EGA processing condition (a use order and a use correction coefficient), and the like), a weighting EGA parameter, an extension EGA processing condition of an EGA optional function (an intra-shot multipoint EGA implementation condition, an EGA computation model, a shot component correction condition, and the like), designation of presence/absence of reject of a sample mark in a unit of sample mark and/or in a unit of sample shot, a reject limit value (a threshold value serving as a reference when judging whether or not to reject the sample mark from the EGA computation) when a sample mark has been detected, and the like.

Meanwhile, the overlay exposure condition correction parameters include a correction amount that is obtained from an EGA polynomial model such as a coefficient of the EGA polynomial model obtained by the EGA computation or a coefficient of the a high-order EGA polynomial model, and a correction amount map in which a correction amount for correcting a nonlinear component of the shot arrangement (wafer grid) and the position of the shot arrangement on wafer W are linked, and the like.

The alignment-related parameters are not limited to those described above. Further, although all the alignment-related parameters are basically variable, the setting is also possible in which all the alignment-related parameters are not variable, but some of the alignment-related parameters are invariable (fixed).

As is described above, the alignment-related parameters can be set as the apparatus parameters in exposure apparatus 100. The setting values of these parameters need to be adjusted in advance so that device patterns on a reticle are accurately transferred so as to be overlaid on wafer W.

Incidentally, there are some cases where shot area $SA_P$ itself deforms similarly to the arrangement of shot areas $SA_P$. A distortion component due to such deformation is also called shot distortion. The shot distortion causes local overlay error of device patterns in shot area $SA_P$. As the causes of the shot distortion, there are synchronous error of a stage holding the reticle and a stage holding the wafer, distortion of a projected image of a projection optical system, and the like. Exposure apparatus 100 has a configuration in which a synchronous correction parameter for correcting the synchronous scanning control state of the stages can also be set and image-forming performance (an aberration component such as distortion) of the projection optical system can be adjusted to some extent. The shot distortion can also be expressed in a polynomial of X and Y. The coefficients of such a polynomial are also parameterized, and are subject to optimization in the embodiment. In the embodiment, it is assumed that the shot distortion can be corrected up to a third-order component by setting parameters of the coefficients of the polynomial. Incidentally, such a configuration of the projection optical system is disclosed in, for example, Kokai (Japanese Unexamined Patent Application Publication) No. 2005-174959 and the like.

Further, as is described above, the device patterns on the reticle are transferred to a plurality of different areas on the wafer by repeating synchronous scanning of the reticle and the wafer and stepping of the wafer. Therefore, because of the dynamic characteristics of the stages that perform the synchronous scanning or the stepping operation or the like, there are some cases where overlay deviation (stepping deviation) of the patterns due to the stepping, or overlay deviation (scanning deviation) of the patterns due to the synchronous scanning occurs. For example, transfer positions of the patterns on wafer W deviate between scanning in the + direction and scanning in the − direction of the stages, or the transfer positions of the patterns deviate due to the stepping direction of the stage. In exposure apparatus 100, correction parameters for correcting such a stepping deviation or a scanning deviation (such as parameters for correcting the relative position of both the stages) can be set as apparatus parameters.

Incidentally, two stages each holding a wafer are arranged in exposure apparatus 100. Wafers to be processed subsequently are alternately loaded on both the stages and sequentially exposed. With such an arrangement, in the middle of performing exposure to a wafer held by one of the stages, another wafer is loaded on the other of the stages and alignment and the like can be performed, and therefore the throughput is improved compared with the case where wafer exchange, alignment and exposure are repeatedly performed on one stage. In FIG. 1, a section that performs scanning exposure to a wafer held by one of the stages is shown as a processing section 1, and a section that performs scanning exposure to a wafer held by the other of the stages is shown as a processing section 2.

[Track]

Within track 200, arranged are a composite measurement/inspection instrument 120 that can perform various measurement/inspection of a wafer before and after exposure (i.e. anterior and posterior) of the wafer in exposure apparatus 100, and a coater/developer (hereinafter, referred to as a C/D) 110 that coats a resist (a photosensitive agent) to the wafer and develops the wafer after exposure.

[Measurement/Inspection Instrument]

Measurement/inspection instrument 120 can operate independently from exposure apparatus 100 and C/D 110. Further, measurement/inspection instrument 120 can output the measurement/inspection result as data to the outside via a communication network within the system. Measurement/inspection instrument 120 performs anterior measurement/inspection that is measurement/inspection before exposure and posterior measurement/inspection that is measurement/inspection after exposure.

In the anterior inspection/measurement, measurement/inspection instrument 120 performs measurement related to optimization of processing conditions in exposure apparatus 100, for example, optimization of alignment-related parameters before wafer W is transported to exposure apparatus 100, as well as foreign substance inspection on wafer W. Measurement/inspection instrument 120 performs position measurement (the EGA measurement) of wafer marks formed on wafer W. If whether or not the wafer marks are appropriate as sample marks can be judged by this anterior measurement, then the EGA measurement of exposure apparatus 100 can be efficient. Measurement/inspection instrument 120 has a position measurement function of wafer marks on wafer W that is equivalent to the alignment system of exposure apparatus 100. That is, measurement/inspection instrument 120 has an alignment system that is matched with the alignment system of exposure apparatus 100. In the alignment system of measurement/inspection instrument 120, alignment-related parameters can be set similarly to the alignment system of exposure apparatus 100. In the alignment system of measurement/inspection instrument 120, the sample marks can be measured in the same state as the alignment system of exposure apparatus 100, and the EGA computation can also be performed based on the result of this EGA measurement. That is, the alignment system of measurement/inspection instrument 120 and the alignment system of exposure apparatus 100 can execute the wafer alignment in the substantially similar state, and both the alignment systems are matched.

Meanwhile, in the posterior measurement/inspection of measurement/inspection instrument 120, besides inspection of defect/foreign substance on wafer W, measurement of overlay error of device patterns on wafer W after exposure (posterior) that have been transferred in exposure apparatus 100 and developed in C/D 110. In the pattern for transfer on the reticle, an overlay measurement mark is formed at a plurality of different locations. Such overlay measurement marks are transferred on wafer W together with device patterns when performing exposure in exposure apparatus 100. Measurement/inspection instrument 120 measures a positional deviation amount of the overlay measurement marks of each layer, thereby measuring overlay error at each location within shot area $SA_P$. From the measurement results, an overlay error distribution of pattern elements within shot area $SA_P$ can be acquired. Further, the average of the overlay errors within shot area $SA_P$ serves as an actual measurement value of the overlay error of the shot area $SA_P$.

[Analytical Apparatus]

Analytical apparatus 500 is an apparatus that operates independently from exposure apparatus 100, C/D 110, and measurement/inspection instrument 120. Analytical apparatus 500 collects various types of data from various apparatuses (e.g. processing contents of the apparatuses), analyzes data related to a series of processes to wafer W. As hardware that realizes such analytical apparatus 500, for example, a personal computer (hereinafter, shortly referred to as a "PC" as needed) can be employed. In this case, the analytical processing is realized by executing an analytical program that is executed by a CPU (not shown) of analytical apparatus 500. This analytical program is recorded in a medium (information recording medium) such as a CD-ROM, and is executed in a state of being installed in the PC from the medium.

Analytical apparatus 500 performs simulation related to the wafer alignment of exposure apparatus 100 based on the measurement results of measurement/inspection instrument 120, and optimizes the alignment-related parameter, the correction parameter of synchronous scanning control, the adjustment parameter of the projection optical system, and the like.

Exposure apparatus 100, C/D 110, and measurement/inspection instrument 120 are inline connected to one another. The inline connection in this case means the connection between the apparatuses and between processing units within each apparatus via a transport device that automatically transports a wafer such as a robot arm and/or a slider. With the inline connection, the time for delivery of wafer W between exposure apparatus 100 and C/D 110 can be remarkably shortened.

Exposure apparatus 100, C/D 110, and measurement/inspection instrument 120 that are inline connected can also be regarded as one substrate processing apparatus (100, 110, 120) as integral. The substrate processing apparatus (100, 200, 120) performs a coating process of coating a photosensitive agent such as a photoresist to wafer W, an exposure process of transferring patterns of a mask or a reticle on wafer W which is coated with the photosensitive agent, a development process of developing the wafer to which the exposure process has been completed, and the like.

That is, in device manufacturing system 1000, a plurality of exposure apparatuses 100, C/Ds 110, and measurement/inspection instruments 120 are arranged. Each substrate processing apparatus (100, 110, 120) and device manufacturing processing apparatus group 900 are installed in a clean room where the temperature and the humidity are controlled. Further, data communication can be performed between the respective apparatuses via a predetermined communication network (e.g. LAN: Local Area Network). This communication network is a communication network that is a so-called intranet arranged with respect to the plants, offices or business establishments of a client.

In the substrate processing apparatus (100, 110, 120), a plurality of wafers (e.g. 25 wafers) are processed as one unit (which is called a lot). In device manufacturing system 1000, the wafers in a lot as a basic unit are processed and commercialized.

Incidentally, although in device manufacturing system 1000, measurement/inspection instrument 120 is placed within track 200 and inline connected to exposure apparatus 100 and C/D 110, a configuration may also be employed in which measurement/inspection instrument 120 is placed outside track 200 and inline connected adjacently, or measurement/inspection instrument 120 is set offline with exposure apparatus 100 and C/D 110.

[Device Manufacturing Processing Apparatus Group]

As device manufacturing processing apparatus group 900, a CVD (Chemical Vapor Deposition) apparatus 910, an etching apparatus 920, a CMP (Chemical Mechanical Polishing) apparatus 930, and oxidation/ion-implantation apparatus 940 are arranged. CVD apparatus 910 is an apparatus that forms a thin film on a wafer, and CMP apparatus 930 is a polisher that planarizes the surface of a wafer by chemical mechanical polishing. Further, etching apparatus 920 is an apparatus that performs etching to a developed wafer, and oxidation/ion-implantation apparatus 940 is an apparatus for forming an oxide film on the surface of the wafer or implanting impurities in a predetermined position on the wafer. Also in CVD apparatus 910, etching apparatus 920, CMP apparatus 930 and oxidation/ion-implantation apparatus 940, two processing sections (processing sections 1 and 2) are arranged to improve the throughput. Further, also in CVD apparatus 910, etching apparatus 920, CMP apparatus 930 and oxidation/ion-implantation apparatus 940, the transportation routes in which a wafer can be transported among these apparatuses are arranged, similarly to exposure apparatus 100 and the like. Besides the apparatuses described above, device manufacturing processing apparatus group 900 also includes apparatuses that perform dicing processing, packaging processing, bonding processing and the like.

Management controller 160 performs control/management of an exposure process that is performed in exposure apparatus 100, and also manages scheduling of exposure apparatus 100. Further, host system 600 (hereinafter, shortly referred to as host 600) performs overall control of entire device manufacturing system 1000.

Figure 3:
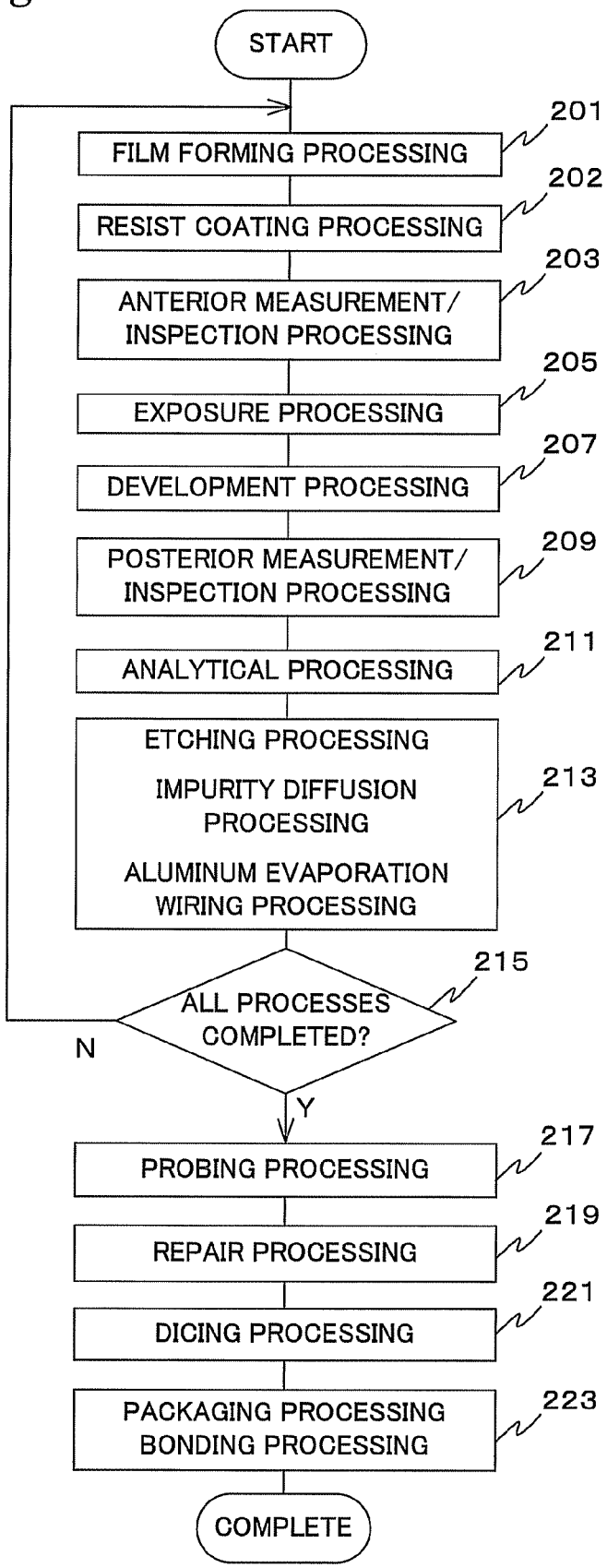
FIG. 3 is a flowchart showing a flow of processes.
Figure 4:
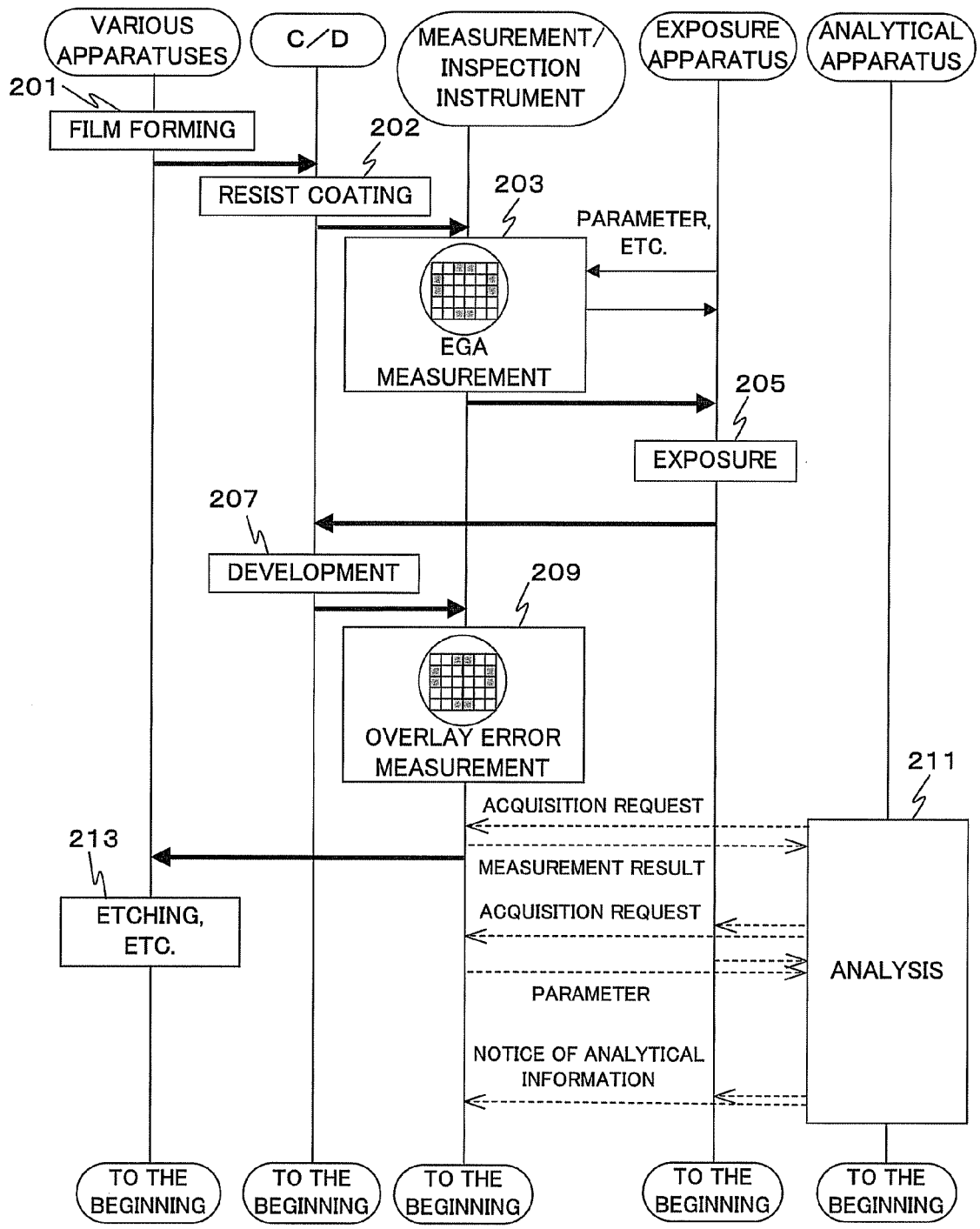
FIG. 4 is a view showing a flow of a wafer and data in the processes.

Next, a series of processes in the device manufacturing process in device manufacturing system 1000 will be described. FIG. 3 shows a flowchart of the series of processes, and FIG. 4 shows a flow of wafer W and a flow of data in a part related to repeated processes in the series of processes. Scheduling and management of the series of processes in the device manufacturing process in device manufacturing system 1000 are performed by host 600 and management controller 160. As is described above, although wafers W are processed in a lot unit, FIGS. 3 and 4 both show the series of processing to one wafer W. In actual practice, the processing shown in FIGS. 3 and 4 is repeated to each of wafers in a lot.

As shown in FIGS. 3 and 4, first of all, a film is formed on wafer W in CVD apparatus 910 (step 201), wafer W is transported to C/D 110, and a resist is coated on wafer W in C/D 110 (step 202). Next, wafer W is transported to measurement/inspection instrument 120, and anterior measurement/inspection processing, that is, inspection of foreign substance on wafer W, optimization of the alignment-related parameter (e.g. selection of sample marks), and the like are performed in measurement/inspection instrument 120 (step 203). When performing the measurement and the optimization, measurement/inspection instrument 120 receives from exposure apparatus 100 data necessary for the anterior measurement, for example, data on the alignment-related parameters (the number and placement of sample marks, parameters required for the EGA measurement or EGA computation, or the like) set in exposure apparatus 100, and sends the inspection result of foreign substance and data related the optimized parameters to exposure apparatus 100. As is described above, performing optimization of the alignment-related parameters beforehand in measurement/inspection instrument 120 has an advantage in throughput over performing the optimization in the alignment system of exposure apparatus 100. Further, as will be described later, in exposure apparatus 100, alignment defect caused by measuring a mark that is not appropriate for the EGA measurement, for example, a mark that has a skewed shape can be avoided.

Subsequently, wafer W is transported to exposure apparatus 100, and in exposure apparatus 100, after the wafer alignment to wafer W is performed using the alignment system, a circuit pattern on the reticle is transferred onto wafer W by performing a step-and-scan operation (step 205). In this case, the wafer alignment is performed under the alignment-related parameters optimized based on the anterior measurement/inspection result in step 203 described above.

Next, wafer W is transported to C/D 110 and development is performed in C/D 110 (step 207). The overlay error (a relative positional deviation amount of the overlay error measurement mark at each location within shot area $SA_P$) between this resist image and the device pattern of a base layer of the resist image is measured by measurement/inspection instrument 120 (step 209). According to a forwarding request from analytical apparatus 500, the measurement result (overlay error data) of measurement/inspection instrument 120 is sent to analytical apparatus 500. Further, according to a forwarding request from analytical apparatus 500, data such as the setting values of the apparatus parameters of exposure apparatus 100 or measurement/inspection instrument 120 is sent to analytical apparatus 500. Based on the data sent from exposure apparatus 100 or measurement/inspection instrument 120, analytical apparatus 500 performs analysis related to the alignment-related parameters (step 211). As shown in FIG. 4, as a result of the analysis, analytical apparatus 500 sends data on the analytical result (analytical information) to measurement/inspection instrument 120 and/or exposure apparatus 100 if needed. Exposure apparatus 100 or measurement/inspection instrument 120 performs the processing such as updating the apparatus parameters based on the information if needed. Incidentally, the details of the analytical processing of step 211 in analytical apparatus 500 will be described later. Further, after analytical apparatus 500 acquires various types of data, exposure apparatus 100 may immediately delete the trace data or the like stored inside.

Meanwhile, wafer W is transported from measurement/inspection instrument 120 to etching apparatus 920, and etching is performed in etching apparatus 920, impurity diffusion processing and aluminum evaporation wiring processing, and film forming in CVD apparatus 910, planarization in CMP apparatus 930, ion implantation in oxidation/ion-implantation apparatus 940, and the like are performed if needed (step 213). Then, the judgment is made in host 600 as to whether or not the all the processes are completed and all the patterns are formed on wafer W (step 215). When the judgment is denied, the procedure returns to step 201, and when the judgment is affirmed, the procedure proceeds to step 217. In this manner, by repeatedly executing the series of processes of film forming/resist coating to etching and the like according to the number of processes, a circuit pattern is layered on wafer W to form a semiconductor device.

After completing the repeated processes, probing processing (step 217) and repair processing (step 219) are executed in device manufacturing processing apparatus group 900. In the case where defect is detected in step 217, for example, processing for substituting a redundant circuit is performed in step 219. Analytical apparatus 500 can also send information of the place where detected abnormality of overlay occurs and the like to an apparatus that performs the probing processing and the repair processing. In an inspection device (not shown), the place where a line width abnormality occurs on wafer W can be excluded chip by chip from the subject to proving processing and repair processing. Afterward, dicing processing (step 221), packaging processing and bonding processing (step 223) are executed, and a product chip is finally completed. Incidentally, the posterior measurement/inspection processing in step 209 may be performed after the etching in step 213. In this case, measurement of overlay error will be performed to images formed after the etching of the wafer.

As is described above, according to the device manufacturing system related the embodiment, overlay abnormality, that is, deterioration of overlay accuracy is detected in the repeated processes in the lot processing and analytical apparatus 500 performs optimization of the apparatus parameters of exposure apparatus 100 so that the abnormality is solved (so that the overlay accuracy is improved), and the optimization result can be immediately reflected in exposure apparatus 100 and/or measurement/inspection instrument 120. Since this optimization can be performed without stopping the lot processing, the productivity of the devices is not lowered.

[Analytical Processing]

In step 211, analytical apparatus 500 can execute the following two analytical processing.
(A) Analytical processing of overlay taking into consideration only overlay error of the entire shot area (hereinafter, referred to as analytical processing A)
(B) Analytical processing of overlay taking into consideration also a distribution of overlay error within a shot area (hereinafter, referred to as analytical processing B)

[Analytical Processing A]

Figure 5:
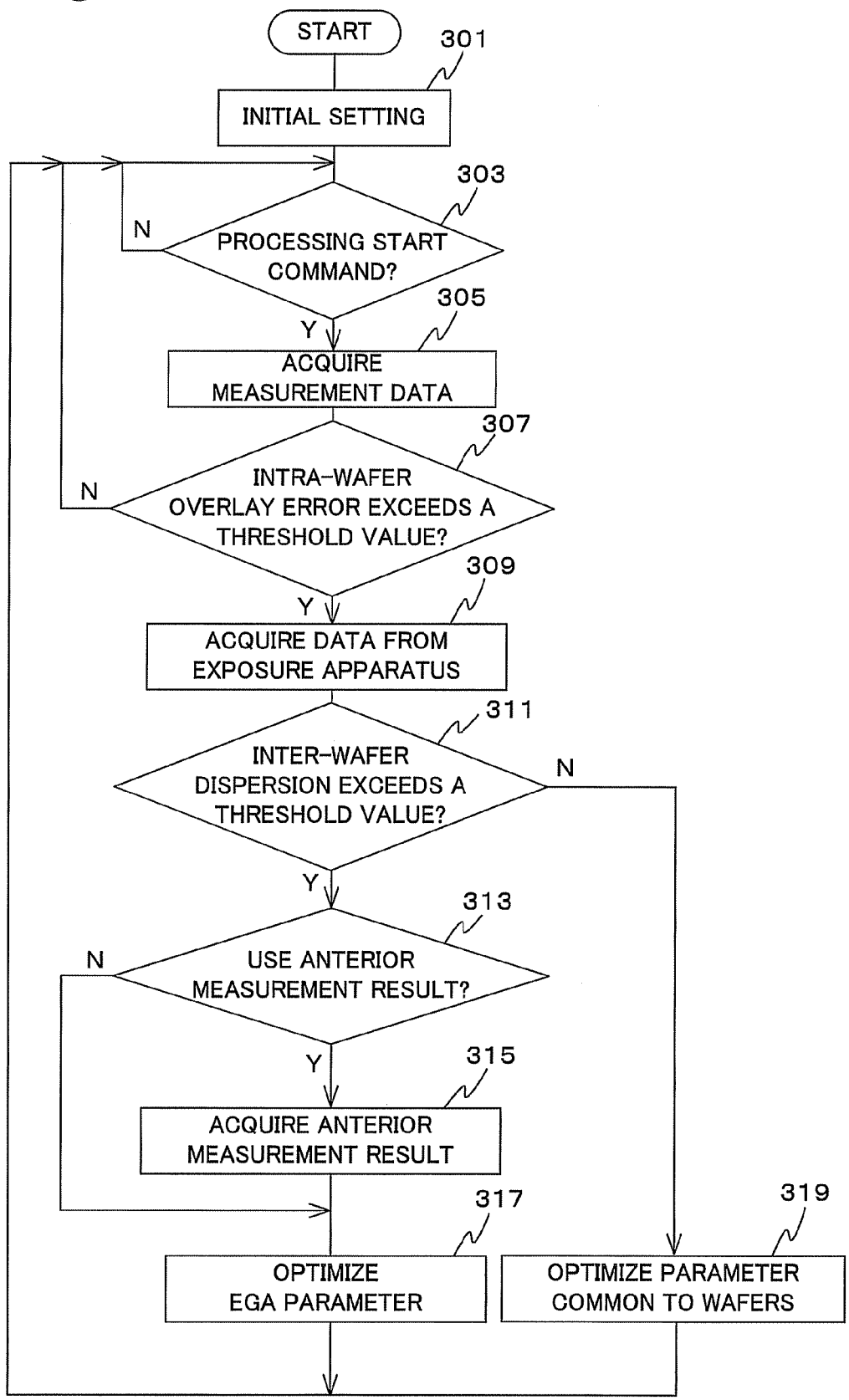
FIG. 5 is a flowchart showing analytical processing A.

First of all, analytical processing A will be described in detail. FIG. 5 shows a flowchart of analytical processing in analytical apparatus 500. As shown in FIG. 5, initial setting is performed first in step 301. Specifically, designation of ON/OFF of alignment-related parameters subject to optimization, threshold value setting for detection of deviation abnormality with respect to measurement results of overlay error, designation of the number of wafers used when computing dispersion of overlay error among wafers W, and the like are performed. As the parameters subject to optimization, there are the alignment processing parameter and the overlay exposure condition correction parameter described above, and the like. If all of these parameters are the subject to optimization, the computation amount required for the optimization will be enormous, which requires the long time, and therefore, the parameters subject to optimization can be limited by the user setting.

Further, as the threshold value used to perform detection of deviation abnormality with respect to measurement results of overlay error described above, which of average, dispersion (threefold standard deviation, that is, $3\sigma$ or the like), the absolute value of the average+the dispersion ($3\sigma$ or the like), a threshold value corresponds to is set here. Incidentally, step 301 is preferably executed before starting step 211 in FIG. 3.

In the next step, step 303, analytical apparatus 500 waits until a processing start command is issued. When the processing start command is issued, first of all, in step 305, analytical apparatus 500 issues a forwarding request of the measurement result to measurement/inspection instrument 120, and acquires an actual measurement value of overlay error from measurement/inspection instrument 120. In step 307, the judgment is made of whether or not a statistical value of the actual measurement value of the overlay error in wafer W exceeds the threshold value. The statistical value in this case is a statistical value of overlay error at the point of each shot area on wafer W and either of the average, the dispersion, or the absolute value of the average+the dispersion that corresponds to the threshold value designated in step 301 described above.

Herein, in the case where the judgment is made that the statistical value of the actual measurement value of overlay error does not exceed the threshold value, that is the overlay deviation in wafer W is small, the procedure returns to step 303, and analytical apparatus 500 waits for a next processing start command. On the contrary, in the case where the judgment is made that the statistical value of the actual measurement value of overlay error exceeds the threshold value, that is, the overlay deviation in wafer W is large and abnormality occurs in overlay, the procedure proceeds to step 309, in which the alignment-related parameters (the alignment processing parameter, and the overlay exposure correction condition parameter) that were set "ON" in step 301, and the alignment result under such parameters are acquired from exposure apparatus 100.

In the next step, step 311, the judgment is made of whether or not the dispersion among wafers of the statistical value of the actual measurement value of overlay error exceeds the threshold value. Herein, in the case where the dispersion among wafers of the statistical value of the actual measurement value of overlay error does not exceed the threshold value, that is, tendency of the overlay deviation coincides among wafers, the procedure proceeds to step 319. In step 319, the setting value of the overlay exposure condition correction parameter for correcting the overlay deviation, which is common to the wafers, is sent to exposure apparatus 100 and optimized.

On the contrary, in the case where the dispersion among wafers of the statistical value of the actual measurement value of overlay error exceeds the threshold value, that is, the tendency of the overlay deviation does not coincide among wafers, the procedure proceeds to step 313, in which the judgment is made of whether or not the measurement result (anterior measurement result) of measurement/inspection instrument 120 should be used for optimization of the alignment-related parameters. When the judgment is affirmed, the procedure proceeds to step 315, and the anterior measurement result is acquired from measurement/inspection instrument 120.

In this case, the anterior measurement result is data that is obtained by executing the anterior measurement with the alignment-related parameters different from those of exposure apparatus 100. As is described above, in measurement/inspection instrument 120, the wafer alignment is performed under the setting state of the alignment-related parameters that is different from the setting state of exposure apparatus 100, and therefore the alignment-related parameters of the different setting and the alignment result under such parameters are acquired here.

Next, the procedure proceeds to step 317, and the EGA parameter with which the dispersion among wafers of the residual error component (EGA random component) and of EGA correction amount is derived by simulation. As the simulation, either of two methods as described below can be selected.

<Simulation Method No. 1>

This is a method in which the result of each of the alignments that are performed to wafer W under a plurality of different alignment-related parameters is used in the anterior measurement processing of measurement/inspection instrument 120. This method is a method in which based on a correlation between the alignment results with respect to wafer W under the actual alignment-related parameters in exposure apparatus 100 and the actual measurement values of overlay error measured in measurement/inspection instrument 120, the setting state of the alignment-related parameters with which the overlay error can be reduced is selected from among a plurality of the alignment results acquired in measurement/inspection instrument 120, or the optimal alignment-related parameter is estimated.

<Simulation Method No. 2>

This is a method in which based on the alignment-related parameters acquired from exposure apparatus 100 or measurement/inspection instrument 120 and the alignment results, the alignment-related parameter with which the overlay error measured in measurement/inspection instrument 120 is reduced is estimated. In exposure apparatus 100, the alignment result with the changed alignment-related parameter is estimated, and an optimal value of the alignment-related parameter is estimated so that the difference (change) between the alignment result with the alignment-related parameters that were used on the wafer alignment to wafer W and the estimated alignment result cancels out the measured overlay error.

In the case where either of the simulation methods is employed, based on the actual measurement value of overlay error in measurement/inspection instrument 120, the setting value of alignment-related parameter of exposure apparatus 100 with which the overlay error is reduced can be obtained. Data on the setting value of alignment-related parameter that has been obtained by the optimization is transmitted from analytical apparatus 500 to exposure apparatus 100 and/or measurement/inspection instrument 120, as analytical information. In exposure apparatus 100, the setting state of the alignment-related parameters is changed based on this data.

That is, in the optimization of the EGA parameter in step 317, only the individual parameter for each wafer is optimized. After finishing step 317 or step 319, the procedure returns to step 303, and waits for a next processing start command.

[Analytical Processing B]

Figure 6:
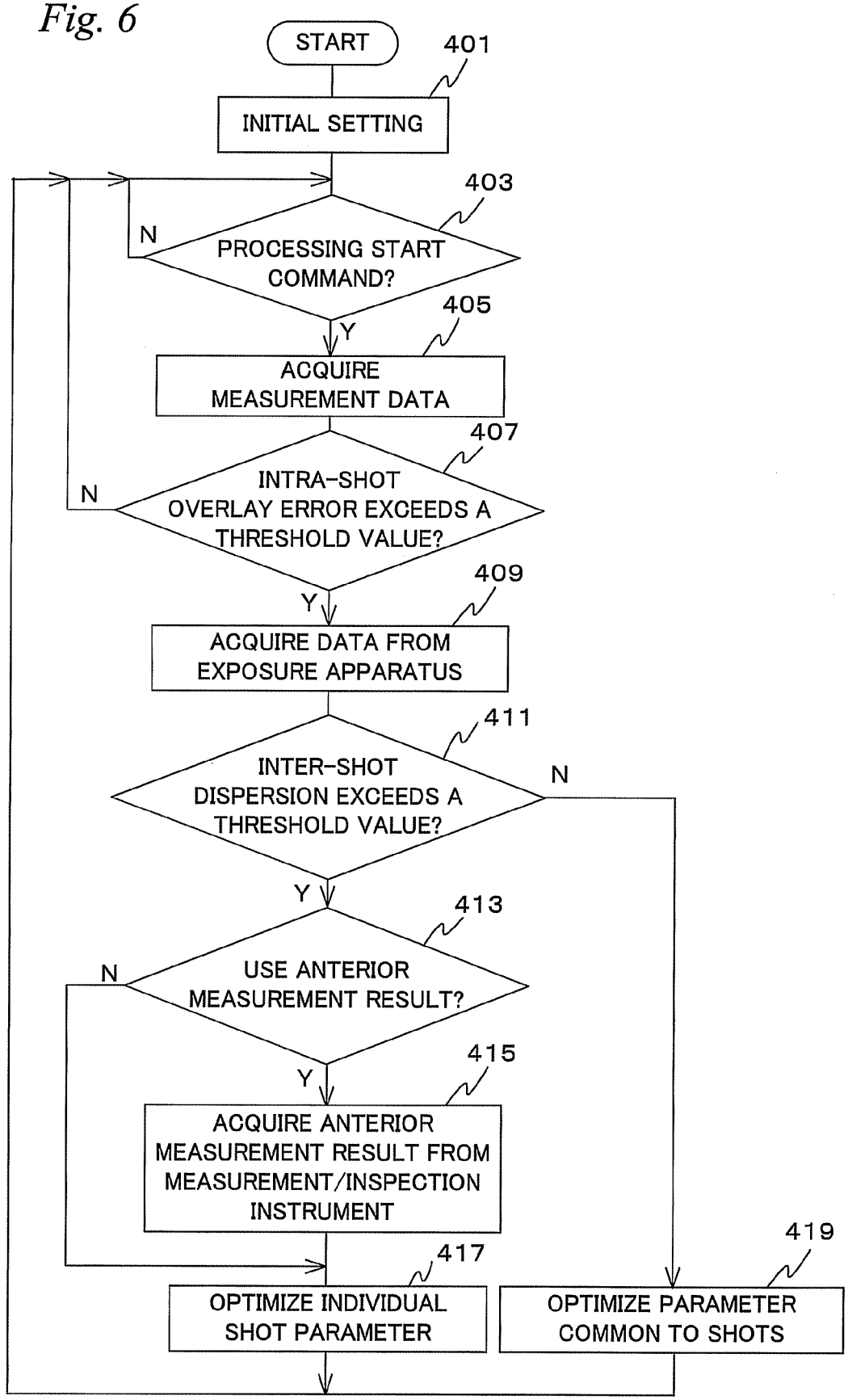
FIG. 6 is a flowchart showing analytical processing B.

Next, analytical processing B will be described in detail. FIG. 6 shows a flowchart of analytical processing in analytical apparatus 500. As shown in FIG. 6, first of all, in step 401, designation of ON/OFF of alignment-related parameters subject to optimization, threshold value setting for detection of deviation abnormality with respect to measurement results of overlay error, designation of the number of wafers used when computing dispersion of overlay error among wafers W, and the like are performed in advance as the initial setting, similarly to step 301 in FIG. 5. The parameters subject to optimization can be limited as in analytical processing A.

In the next step, step 403, analytical apparatus 500 waits until a processing start command is issued. When the processing start command is issued, the procedure proceeds to step 405, in which measurement data of overlay error is acquired from measurement/inspection instrument 120. In step 407, the judgment is made of whether or not the measurement result of overlay error within shot area $SA_P$ exceeds the threshold value. Herein, in the case where a statistical value of the actual measurement value of overlay error does not exceed the threshold value, that is, the overlay is normal, the procedure returns to step 403 to wait for a next processing start command.

On the contrary, in the case where a statistical value of the actual measurement value of overlay error exceeds the threshold value, that is, the overlay is abnormal, the procedure proceeds to step 409, and data on reticle manufacturing error, reticle rotation error, adjustment parameters of the projection optical system, and the parameters of the stage control system is acquired from exposure apparatus 100.

In the next step, step 411, the judgment is made of whether or not the dispersion among shot areas $SA_P$ on wafer W of statistical values of the actual measurement values of overlay error after removing the reticle manufacturing error and the reticle rotation error exceeds the threshold value. Herein in the case where the dispersion among shot areas $SA_P$ of the statistical values of the actual measurement values of overlay error does not exceed the threshold value, that is, tendency of a distribution of the actual measurement values of overlay error coincides among shot areas $SA_P$, the procedure proceeds to step 419, and the correction parameter of shot distortion for correcting the distribution of the overlay error of the shot areas is computed based on the adjustment parameter of the projection optical system, the control system parameter of the stages and the like, using the measurement result of the average among the shots after removal of the reticle manufacturing error and the reticle rotation error, and the correction parameter is transmitted to exposure apparatus 100 for optimization. Incidentally, such a computation method of the correction parameter is disclosed in, for example, Kokai (Japanese Unexamined Patent Application Publication) No. 2005-174959, and the like.

On the contrary, in the case where the dispersion among shot areas $SA_P$ of the statistical values of the actual measurement values of overlay error exceeds the threshold value, that is, there is the dispersion in the overlay error distribution (tendency of deviation) among shot areas $SA_P$, the procedure proceeds to step 413, and the judgment is made of whether or not the anterior measurement result of measurement/inspection instrument 120 should be used. In the case of using the anterior measurement result, in step 415, the alignment-related parameters and the alignment result under the parameters are acquired from measurement/inspection instrument 120, similarly to step 315 in FIG. 5.

In step 417, parameters with which a correction amount of a transfer position of a pattern is different among the shots are optimized, such as an alignment-related parameter that can correct a nonlinear component of a wafer grid or the like, for example, a coefficient of the high-order EGA polynomial model (including the intra-shot EGA) or the like. Optimization of these parameters is disclosed in, for example, Kokai (Japanese Unexamined Patent Application Publication) No. 2002-353121 and the corresponding U.S. Patent Application Publication No. 2002/0042664, and the like. As long as the national laws in designated states or elected states, to which this international application is applied, permit, the disclosure of the publication and the corresponding U.S. patent application Publication cited above are fully incorporated herein by reference.

Data on the optimized alignment-related parameters is transmitted to measurement/inspection instrument 120 and/or exposure apparatus 100. After that, the procedure returns to step 403 to wait a next processing start command.

Incidentally, analytical processing A and analytical processing B can arbitrarily be used in combination. For example, both analytical processing A and analytical processing B may be executed to each wafer, or analytical processing A may be performed to odd-numbered wafers W and analytical processing B may be performed to even-numbered wafers W in a lot, or analytical processing A and analytical processing B may be performed only to the wafer at the head of a lot and only analytical processing A may be executed to the remaining wafers. With such an operation, shot distortion correction in a unit of a wafer, and further, optimal overlay including also the high-order EGA (including the intra-shot high-order EGA) can be performed.

Incidentally, in both of analytical processing A and analytical processing B, it is necessary to appropriately set the correction parameters of stepping deviation, scanning deviation and the like described above and to prevent these deviations from affecting overlay error.

Incidentally, measurement/inspection instrument 120 has the two processing sections (processing sections 1 and 2), and in the embodiment, management of the processing sections is performed so that both the anterior measurement processing and the posterior measurement processing are performed by the same processing section with respect to the same wafer W. With such management, error due to the difference (matching error) of the states of both processing sections can be prevented from occurring in the above-described simulation. Even when such restriction is provided, in the case where the wafers in a lot are processed in a pipeline method (i.e. in the case where a process immediately before a process which is performed to a preceding wafer at present is performed to a succeeding wafer without interruption), decrease in the throughput can be prevented since the two processing sections are arranged in measurement/inspection instrument 120.

Incidentally, in the embodiment, the anterior measurement processing and the posterior measurement processing are to be performed to each wafer W, but it is not always necessary to do so. For example, the anterior measurement processing and the posterior measurement processing may be performed to every several wafers, or at a constant time interval (every other hour, every other day, every other week or the like). Such an interval may be fixed or may be variable. For example, in the case where abnormality of overlay error is detected, the interval at which the anterior measurement processing and the posterior measurement processing are performed may be shortened, and in the case where abnormality of overlay error is not detected consecutively, the interval at which the anterior measurement processing and the posterior measurement processing are performed may be lengthened. That is, in the case where the overlay accuracy is judged to be stable based on a history of past anterior measurement processing and posterior measurement processing, the frequency of these measurement processing can be decreased, and in the case where overlay abnormality is detected and the overlay accuracy deteriorates, the frequency of these measurement processing can be increased.

For example, measurement of overlay error is performed to only a wafer at the head of the lot in measurement/inspection instrument 120 in usual cases, and in the case where the judgment is made that the overlay accuracy deteriorates based on the actual measurement values of the usual measurement, the alignment-related parameters are optimized in analytical apparatus 500. Afterward, the measurement of overlay error is performed to each wafer and if overlay abnormality is not detected consecutively, the measurement frequency of the anterior measurement processing and the posterior measurement processing may be gradually decreased from every fourth wafer, to every eleventh wafer, and to only a wafer at the head of a lot.

Further, in the embodiment, there is one judgment level (one threshold value) for overlay abnormality, but the judgment level may also be set in a plurality of stages. By setting the plurality of judgment levels, the processing states of various apparatuses that will be executed later can be changed in accordance with the respective judgment levels. For example, two threshold values, which are a high threshold value and a low threshold value, are set, and in the case where a statistical value of an actual measurement value of overlay error intermediates between the two threshold values, only optimization of the alignment-related parameter of exposure apparatus 100 is performed and pattern reject is not performed, and in the case where a statistical value of an actual measurement value of overlay error even exceeds the high threshold value, both the optimization of the alignment-related parameters and the reject can be performed. Further, not limited thereto, the processing contents of not only exposure apparatus 100, but also C/D 110, measurement/inspection instrument 120, each apparatus of device manufacturing processing apparatus group 900 and the like can be adjusted step by step.

As is described in detail above, according to the embodiment, while a series of device manufacturing processes including the wafer alignment and the exposure process thereafter are sequentially performed to each of a plurality of wafers W in a unit of one lot, overlay error between a device pattern that has been formed in each of a plurality of shot areas $SA_P$ on wafer W and a device pattern that is formed by transfer so as to be overlaid with the already formed device pattern is actually measured for each wafer W using measurement/inspection instrument 120, and in the case where the judgment is made that the overlay accuracy of the device patterns deteriorates based on the actual measurement result, the alignment-related parameter of the wafer alignment is optimized using analytical apparatus 500. That is, in this device manufacturing system, since the processing condition of alignment is optimized by analytical apparatus 500 without stopping the series of device manufacturing processes, even if the overlay accuracy deteriorates during the lot processing, the overlay accuracy can promptly be improved.

Analytical apparatus 500 detects abnormality of the overlay accuracy based on the actual measurement value (measurement result of measurement/inspection instrument 120) of the overlay error between the device patterns formed on a plurality of shot areas on wafer W and the device patterns transferred so as to be overlaid with the already formed device patterns. Then, only in the case where the abnormality is detected, the alignment-related parameter of the wafer alignment is optimized based on a correlation between the actual measurement value of overlay error and the alignment-related parameter. That is, according to the embodiment, because optimization of the alignment-related parameter is performed only in the case where the overlay abnormality is detected, unnecessary processing can be prevented from being executed.

Further, analytical apparatus 500 is capable of executing a plurality of different optimization processing of optimizing the alignment-related parameters, and the optimization processing to be actually executed is selected based on the measurement result of measurement/inspection instrument 120, that is, the actual measurement value of overlay error.

For example, in the analytical processing, when a dispersion degree of the actual measurement values of overlay error among wafers W is more than or equal to a threshold value, the processing of optimizing the alignment-related parameter of the wafer alignment is individually performed to each wafer W (step 317). On the other hand, when a dispersion degree of the actual measurement values of overlay error among wafers W is less than the threshold value, the processing of optimizing the alignment-related parameter common to wafers W is performed (step 319). With this arrangement, because the optimization processing according to the actual overlay state of wafer W can be performed, the overlay accuracy is improved.

Incidentally, according to the embodiment, because the alignment by the EGA method is employed in exposure apparatus 100, the residual error component between the EGA correction amount of the shot area in the EGA model and the actual measurement position thereof is made to be the minimum with respect to a plurality of wafers W. This is because the value obtained when the residual error component is the minimum is the most proper parameter setting value, also from the statistical viewpoint. The present invention is not, however, limited to the statistical global alignment method, but for example, can naturally be applied to optimization of parameters for alignment by a die-by-die method.

Further, according to the embodiment, optimization of parameters related to overlay is performed not only for the overlay of shot areas $SA_P$ but also the local overlay within shot area $SA_P$. Also in this case, with respect to each wafer W, overlay error of a pattern at each point within shot area $SA_P$ that is formed by transfer on wafer W and within shot areas $SA_P$ of the lower layers is actually measured, and in the case where the judgment is made that their overlay accuracy deteriorates based on the actual measurement result, the apparatus parameter of exposure apparatus 100 is optimized. With this arrangement, the overlay error within shot area $SA_P$ on wafer W can be reduced in exposure apparatus 100 without stopping the device manufacturing processes, and therefore even if the overlay accuracy of each pattern within shot area $SA_P$ deteriorates, the overlay accuracy can promptly be improved.

Also in this case, optimization of the apparatus parameter of exposure apparatus 100 is performed only in the case where overlay abnormality is detected within shot area $SA_P$, and accordingly unnecessary processing can be prevented from being executed.

Further, analytical apparatus 500 selects the optimization processing to be actually executed based on the actual measurement value of overlay error. For example, in the case where dispersion of a distribution of overlay error within shot area $SA_P$ between an overlay measurement mark within shot area $SA_P$ on an object and an overlay measurement mark of a resist image that is newly formed by transfer is more than or equal to a threshold value among shot areas $SA_P$, step 417 is executed that optimizes an individual parameter different among the shots, for example, a parameter of which a correction amount is different among the shots such as an alignment-related parameter with which a nonlinear component of the arrangement of shot areas $SA_P$ (wafer grid) on wafer W can be corrected.

On the other hand, in the case where dispersion of a distribution of overlay error within shot area $SA_P$ is less than a threshold value among shot areas $SA_P$, the optimization processing of step 419 is executed in which a parameter common to shot areas $SA_P$ is optimized. To be more specific, in this processing, the processing condition to be optimized can include a processing condition related to a forming state of an image projected on wafer W, for example, an adjustment parameter for changing image-forming characteristics of the projection optical system.

Incidentally, the parameter that can be adjusted in step 419 is not limited to the adjustment parameter of the projection optical system but a correction parameter for correcting the relative position of wafer W and the reticle during scanning can be included. In step 417 described above, because the distribution of overlay error in each shot area $SA_P$ is different, the correction parameter is changed for each of shot areas $SA_P$, but in step 419, because the distribution of overlay error in shot area $SA_P$ is common to shot areas $SA_P$, the setting value of the parameter may be the same among shot areas $SA_P$.

Further, in the embodiment, in accordance with the detection frequency of patterns of which overlay abnormality is detected, the interval, at which measurement of overlay error in measurement/inspection instrument 120 and optimization of the apparatus parameter of exposure apparatus 100 and/or measurement/inspection instrument 120 in analytical apparatus 500 are performed, is increased or decreased. With this arrangement, in the case where the reliability of device manufacturing processes of device manufacturing system 1000 is determined to be maintained at a high level, a process of determining the reliability is simplified to streamline the entire system, thereby further improving the productivity of devices.

Incidentally, in accordance with the detection frequency of patterns whose overlay is judged to be abnormal, the interval at which defect of patterns is inspected may also be changed. Even with such an arrangement, in the case where the reliability of device manufacturing processes of device manufacturing system 1000 is determined to be maintained at a high level, a process of determining the reliability is simplified to streamline the entire system.

Further, in the embodiment, based on the statistical value of the actual measurement value of overlay, the overlay abnormality is detected. With this detection, it becomes possible to detect overlay abnormality in a manner that is proper from the statistical viewpoint. The statistical value is to be one of the average value, the dispersion, the sum of the average value and the dispersion of the actual measurement values of overlay error, but other statistical values can also be employed as far as such statistical values can be used to detect deterioration in the overlay accuracy.

Further, in the embodiment, the pattern of which overlay abnormality is detected can also be designated as a pattern to be excluded from the subject to the subsequent processing. For example, a chip that includes a pattern whose overlay is judged to be abnormal can be excluded from the processing subject by the chip, by the shot, by the wafer, or by the lot. With this operation, it is possible to promptly detect a portion that lowers the yield of products and exclude it from the subsequent processing, and therefore reduction in the entire yield can be prevented.

Further, in the embodiment, the judgment level for judging overlay abnormality of patterns can be set in a plurality of stages, and in accordance with the respective judgment levels of the overlay of the patterns, the subsequent processing states can be changed. For example, in accordance with the judgment level, optimization of the parameter or reject of the portion where the abnormality occurs can selectively be executed. Accordingly, the flexible operation according to a state of the process in the device manufacturing system can be performed.

Incidentally, it is a matter of course that detection of overlay abnormality of patterns may be notified to exposure apparatus 100, C/D 110 and measurement/inspection instrument 120. By this notice, exposure apparatus 100, C/D 110 and measurement/inspection instrument 120 can change the subsequent processing, and therefore, the flexible operation of the respective apparatuses can be performed.

Device manufacturing system 1000 related to the embodiment described above can be deemed to be a device manufacturing system that is equipped with analytical apparatus 500 as an overlay management apparatus that manages overlay of device patterns on wafer W based on data related to exposure apparatus 100 and the measurement result of the anterior measurement/inspection processing. Because of being equipped with analytical apparatus 500, the overlay accuracy of device patterns on the wafer is improved and the productivity of devices is improved.

Further, device manufacturing system 1000 is further equipped with measurement/inspection instrument 120 that performs measurement of wafer alignment of wafer W and optimization of the alignment-related parameter before wafer W is transported into exposure apparatus 100, and analytical apparatus 500 can also take into consideration the measurement result and the result of the optimization of measurement/inspection instrument 120 when performing the management of overlay of patterns on wafer W. That is, according to the present invention, the result of the anterior measurement/inspection to wafer W can be reflected in the management of overlay of the patterns.

Moreover, in the embodiment, analytical apparatus 500 mainly optimizes the processing condition in exposure apparatus 100, but it is a matter of course that the processing condition in measurement/inspection instrument 120 that performs optimization of the alignment-related parameter, that is, performs the anterior measurement/inspection processing may be the subject to optimization, for example, by itself.

Further, in device manufacturing system 1000, analytical apparatus 500 is to be a separate apparatus that is independent from various device manufacturing processing apparatuses, but the present invention is not limited thereto. For example, the analytical function that analytical apparatus 500 has may be equipped in either of the device manufacturing processing apparatuses in the system. For example, the analytical function may be equipped in measurement/inspection instrument 120, exposure apparatus 100, host 600, management controller 160 or the like.

Incidentally, the device manufacturing processes in device manufacturing system 1000 can include the exposure processing in exposure apparatus 100 (step 205), the posterior measurement/inspection processing of measuring overlay error of patterns on wafer W (step 209) after the exposure processing has been executed, and the analytical processing in analytical apparatus 500 (step 211) as the overlay management processing of managing the overlay of patterns on wafer W based on data on the exposure processing and measurement data of the posterior measurement/inspection processing.

Further, in the embodiment, the device manufacturing processes further include the anterior measurement/inspection processing of measuring information on alignment of wafer W (step 203) that is performed prior to the exposure processing. When managing the overlay of patterns on wafer W, the processing result in the anterior measurement/inspection processing can be taken into consideration, and at least one of the processing condition in the exposure processing and the processing condition in the anterior measurement/inspection processing can be the subject to optimization.

Further, measurement/inspection instrument 120 is equipped with the two processing sections, but the processing section that performs the anterior measurement/inspection processing and the processing section that performs the posterior measurement/inspection processing can be the same section. With this arrangement, error due to mismatching between the measurement instruments for the anterior measurement/inspection processing and the posterior measurement/inspection processing can be prevented from being incorporated.

Further, according to the embodiment, analytical apparatus 500 is to be a computer and its analytical function is to be realized by a program that is executed by the computer. Since this program is downloaded from internet or installed from the recorded state in an information recording medium such as CD-ROM, addition, change or modification of the analytical function itself can be made without difficulty.

In the embodiment, measurement/inspection instrument 120, exposure apparatus 100 and the like are to be inline connected, but measurement/inspection instrument 120 may be an offline measurement instrument that is not inline connected to exposure apparatus 100 and track 200, as is described previously. Further, a measurement/inspection instrument that performs the anterior measurement/inspection processing and a measurement/inspection instrument that performs the posterior measurement/inspection processing may be separately arranged, and either one of them may be offline, not inline.

In the embodiment, exposure apparatus 100 is to be an exposure apparatus by a step-and-scan method, but the present invention is not limited thereto, and an exposure apparatus by a step-and-repeat method or another method may also be employed. As is represented by exposure apparatus 100, types of other various apparatuses are not limited. Further, the present invention can be applied to not only the semiconductor manufacturing process but also a manufacturing process of displays including liquid crystal display devices and the like. Further, it goes without saying that the present invention can be applied to overlay management in all the device manufacturing processes, besides a process of transferring a device pattern onto a glass plate, a manufacturing process of thin film magnetic heads, and a manufacturing process of imaging devices (such as CCDs), micro machines, organic ELs, DNA chips and the like.

Further, in the embodiment above, analytical apparatus 500 is to be, for example, a computer. That is, the analytical processing in analytical apparatus 500 is realized by the analytical program being executed by the PC. This analytical program may be capable of being installed in the PC via a medium, or of being downloaded in the PC via internet, as is described previously. Further, analytical apparatus 500 can be configured of hardware as a matter of course.

The present invention can be applied to not only the device manufacturing system described above but also any apparatus as far as the apparatus performs alignment of an object.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An overlay management method, comprising:
   sequentially, using an exposure apparatus, performing to each of a plurality of objects a series of processes that include a transfer process in which with respect to a first pattern on an object, a second pattern to be transferred is transferred so as to be overlaid after alignment processing of the first pattern and the second pattern is performed, and in parallel with said sequentially performing, executing an optimization process in which an overlay error between the first pattern and the second pattern on the object is actually measured using a measurement instrument at arbitrary timing, and in the case where overlay accuracy of the patterns is judged to deteriorate based on a result of the actual measurement, a processing condition of the alignment processing is optimized using an analytical apparatus.

2. The overlay management method according to claim 1, wherein
the optimization process includes
a first sub-process in which abnormality of the overlay accuracy is detected based on an actual measurement value of the overlay error between the first pattern and the second pattern; and
a second sub-process in which in the case where the abnormality has been detected, the processing condition of the alignment processing is optimized based on a correlation between the actual measurement value of the overlay error and the processing condition.

3. The overlay management method according to claim 2, wherein
in the second sub-process,
a plurality of different optimization processing in which the processing condition of the alignment processing is optimized can be executed, and
the optimization processing to be actually executed is selected based on the actual measurement value of the overlay error between the first pattern and the second pattern.

4. The overlay management method according to claim 3, wherein
in the second sub-process,
in the case where a dispersion degree among the objects of the actual measurement value of the overlay error between the first pattern and the second pattern is more than or equal to a predetermined level, first optimization processing in which the processing condition of the alignment processing is individually optimized for each of the objects is performed, and
in the case where a dispersion degree among the objects of the actual measurement value of the overlay error between the first pattern and the second pattern is less than the predetermined level, second optimization processing in which the processing condition of the alignment processing common to the objects is optimized is performed.

5. The overlay management method according to claim 4, wherein
the alignment processing is processing in which the second pattern is positioned according to an arrangement model of the first pattern formed in each of a plurality of areas on the object, and
in the first optimization processing, the processing condition of the alignment processing is optimized so that a residual error component between a position of each of the areas in the arrangement model and an actually measured position of each of the areas is minimum for all the plurality of objects.

6. The overlay management method according to claim 1, wherein
the processing condition of the alignment processing includes
a processing parameter group that includes a measurement condition in a measurement device that measures the number, a placement, a shape and a position of a mark subject to position measurement out of a plurality of marks arranged with the first pattern formed on the object, and a computation condition of computation processing that is executed based on a result of the measurement, and
an overlay exposure correction condition parameter group used to correct a transfer position of the second pattern on the object that is computed based on a position measurement result of the mark by the measurement device.

7. The overlay management method according to claim 1, wherein
in accordance with a detection frequency of a pattern of which abnormality of overlay has been detected, an interval at which the optimization process is performed is increased or decreased.

8. The overlay management method according to claim 1, wherein
abnormality of the overlay is detected based on a statistical value related to the actual measurement value of the overlay error.

9. The overlay management method according to claim 8, wherein
the statistical value is at least one of an average value, dispersion, a sum of the average value and the dispersion of the actual measurement value of the overlay error.

10. The overlay management method according to claim 1, wherein
a pattern of which abnormality of overlay has been detected is designated as a pattern to be excluded from a subsequent processing subject.

11. The overlay management method according to claim 10, wherein
the object is a semiconductor substrate, and
a chip including a pattern of which overlay is judged to be abnormal is excluded from the subsequent processing subject by the chip.

12. The overlay management method according to claim 1, wherein
a judgment level of abnormality of overlay of the pattern is set in a plurality of stages, and
in accordance with each of the judgment levels of abnormality of overlay of the pattern, a subsequent processing state is changed.

13. The overlay management method according to claim 1, wherein
in accordance with a detection frequency of a pattern of which overlay has been judged to be abnormal, at least one of an interval at which information on overlay of the pattern is measured and an interval at which information on defect of the pattern is inspected is changed.

14. The overlay management method according to claim 1, wherein
a fact that abnormality of overlay of the pattern has been detected is notified to an apparatus that has performed at least a part of the series of processes.

15. The overlay management method according to claim 1, wherein
the arbitrary timing is any one of each of the objects, each time when a predetermined number of the objects are processed, and a predetermined time interval.

16. A device manufacturing method, comprising:
an exposure process in which a pattern is transferred so as to be overlaid to each of a plurality of different areas on an object;
a posterior measurement process in which information on an overlay error of the pattern is measured after the exposure process is executed; and
an overlay management process in which overlay of the pattern on the object is managed based on information on the exposure process and information on a measurement result of the posterior measurement process, using the overlay management method according to claim 1.

17. The device manufacturing method according to claim 16, further comprising:
an anterior measurement process in which information on alignment of the object is measured, prior to the exposure process, wherein
in the overlay management process, a measurement result of the anterior measurement process is taken into consideration when overlay of the pattern on the object is managed.

18. The device manufacturing method according to claim 17, wherein
in the overlay management process, at least one of a processing condition in the exposure process and a processing condition in the anterior measurement process is optimized.

19. The device manufacturing method according to claim 17, wherein
a measurement instrument that performs the anterior measurement process and a measurement instrument that performs the posterior measurement process are the same instrument.

20. A program that makes a computer execute analytical processing of a processing condition of alignment processing of an object and a pattern when the pattern is formed so as to be overlaid to each of a plurality of different areas on the object, using the overlay management method according to claim 1.

21. An information recording medium that can be read by a computer in which the program according to claim 20 is recorded.

22. An overlay management method, comprising:
sequentially, using an exposure apparatus, performing to each of a plurality of objects a series of processes that include a transfer process in which, with respect to a first pattern formed in each of a plurality of areas on an object, a second pattern to be transferred is transferred so as to be overlaid after alignment processing of the first pattern and the second pattern is performed,
in parallel with said sequentially performing, executing an optimization process in which an overlay error between a pattern element of the first pattern and a pattern element of the second pattern on the object is actually measured using a measurement instrument at arbitrary timing, and in the case where overlay accuracy of the patterns is judged to deteriorate based on a result of the actual measurement, a processing condition in the series of processes is optimized using an analytical apparatus.

23. The overlay management method according to claim 22, wherein
the optimization process includes
a first sub-process in which abnormality of overlay is detected based on an actual measurement value of the overlay error between the pattern element of the first pattern and the pattern element of the second pattern; and
a second sub-process in which in the case where the abnormality has been detected, the processing condition in the series of processes is optimized based on a correlation between the actual measurement value of the overlay error and the processing condition.

24. The overlay management method according to claim 23, wherein
in the second sub-process,
a plurality of different optimization processing in which the processing condition in the series of processes is optimized can be executed, and
the optimization processing to be actually executed is selected based on the actual measurement value of the overlay error between the pattern element of the first pattern and the pattern element of the second pattern.

25. The overlay management method according to claim 24, wherein
in the second sub-process,
in the case where dispersion among the areas of a distribution of the overlay error between the pattern element of the first pattern and the pattern element of the second pattern is more than or equal to a predetermined level, first optimization processing in which the processing condition in the series of processes is individually optimized for each of the areas is executed, and
in the case where dispersion among the areas of a distribution of the overlay error between the pattern element of the first pattern and the pattern element of the second pattern is less than the predetermined level, second optimization processing in which a processing condition common to the areas is optimized is executed.

26. The overlay management method according to claim 25, wherein
in the second optimization processing,
the processing condition to be optimized includes a processing condition related to a forming state of an image of the second pattern to the object.

27. The overlay management method according to claim 26, wherein
the transfer process includes a process in which the second pattern is transferred so as to be overlaid with the first pattern via a projection optical system, and
the processing condition related to the forming state of the image of the second pattern to the object includes a processing condition used to adjust an image-forming characteristic of the projection optical system.

28. The overlay management method according to claim 25, wherein
in the first optimization processing, the processing condition to be optimized includes a parameter that can correct a nonlinear component with respect to an arrangement of each pattern element on the object.

29. The overlay management method according to claim 28, wherein
the parameter that can correct the nonlinear component includes one of a high-order calculating formula model of alignment processing and a high-order position correction parameter.

30. The overlay management method according to claim 22, wherein
a processing condition of the alignment processing includes
a processing parameter group that includes a measurement condition in a measurement device that measures the number, a placement, a shape and a position of a mark subject to position measurement out of a plurality of marks arranged with the first pattern formed on the object, and a computation condition of computation processing that is executed based on a result of the measurement, and
an overlay exposure correction condition parameter group used to correct a transfer position of the second pattern on the object that is computed based on a position measurement result of the mark by the measurement device.

31. The overlay management method according to claim 22, wherein
in accordance with a detection frequency of a pattern of which abnormality of overlay has been detected, an interval at which the optimization process is performed is increased or decreased.

32. The overlay management method according to claim 22, wherein
abnormality of the overlay is detected based on a statistical value related to the actual measurement value of the overlay error 33. The overlay management method according to claim 32, wherein
the statistical value is at least one of an average value, dispersion, a sum of the average value and the dispersion of the actual measurement value of the overlay error.

34. The overlay management method according to claim 22, wherein
a pattern of which abnormality of overlay has been detected is designated as a pattern to be excluded from a subsequent processing subject.

35. The overlay management method according to claim 34, wherein
the object is a semiconductor substrate, and
a chip including a pattern of which overlay has been judged to be abnormal is excluded from the subsequent processing subject by the chip.

36. The overlay management method according to claim 22, wherein
a judgment level of abnormality of overlay of the pattern is set in a plurality of stages, and
in accordance with each of the judgment levels of abnormality of overlay of the pattern, a subsequent processing state is changed.

37. The overlay management method according to claim 22, wherein
in accordance with a detection frequency of a pattern of which overlay has been judged to be abnormal, at least one of an interval at which information on overlay of the pattern is measured and an interval at which information on defect of the pattern is inspected is changed.

38. The overlay management method according to claim 22, wherein
a fact that abnormality of overlay of the pattern has been detected is notified to an apparatus that has performed at least a part of the series of processes.

39. The overlay management method according to claim 22, wherein
the arbitrary timing is any one of each of the objects, each time when a predetermined number of the objects are processed, each of the pattern elements on the object, each time when a predetermined number of the pattern elements on the object are processed, and a predetermined time interval.

40. A device manufacturing method, comprising:
an exposure process in which a pattern is transferred so as to be overlaid to each of a plurality of different areas on an object;
a posterior measurement process in which information on an overlay error of the pattern is measured after the exposure process is executed; and
an overlay management process in which overlay of the pattern on the object is managed based on information on the exposure process and information on a measurement result of the posterior measurement process, using the overlay management method according to claim 22.

41. The device manufacturing method according to claim 40, further comprising:
an anterior measurement process in which information on alignment of the object is measured, prior to the exposure process, wherein
in the overlay management process, a measurement result of the anterior measurement process is taken into consideration when overlay of the pattern on the object is managed.

42. The device manufacturing method according to claim 41, wherein
in the overlay management process, at least one of a processing condition in the exposure process and a processing condition in the anterior measurement process is optimized.

43. The device manufacturing method according to claim 41, wherein
a measurement instrument that performs the anterior measurement process and a measurement instrument that performs the posterior measurement process are the same instrument.

44. A program that makes a computer execute analytical processing of a processing condition of alignment processing of an object and a pattern when the pattern is formed so as to be overlaid to each of a plurality of different areas on the object, using the overlay management method according to claim 22.

45. An information recording medium that can be read by a computer in which the program according to claim 44 is recorded.

46. A method comprising:
performing wafer alignment and exposure by an exposure apparatus to transfer a plurality of patterns on a wafer; and
in parallel with said performing wafer alignment and exposure,
actually measuring an overlay error between patterns that have been transferred to the wafer,
determining, using an analytical apparatus, whether the actually measured overlay error indicates deterioration of overlay accuracy which thereby requires optimization of said wafer alignment, and
when said determining determines that the actually measured overlay error indicates deterioration of overlay accuracy which thereby requires optimization of said wafer alignment, optimizing parameters of said wafer alignment.

* * * * *

UNITED STATES PATENT AND TRADEMARK OFFICE
CERTIFICATE OF CORRECTION

PATENT NO. : 7,718,327 B2
APPLICATION NO. : 12/176902
DATED : May 18, 2010
INVENTOR(S) : Shinichi Okita It is certified that error appears in the above-identified patent and that said Letters Patent is hereby corrected as shown below:

Column 27, Line 5, change "error" to --error.--.

Signed and Sealed this

Seventeenth Day of August, 2010

David J. Kappos
*Director of the United States Patent and Trademark Office*